April 21, 1970 T. A. STANSELL, JR 3,508,248
PHASE MODULATOR DECODER
Filed Oct. 22, 1965 2 Sheets-Sheet 1

THOMAS A. STANSELL, Jr.
INVENTOR

BY Claude Funkhouser
ATTORNEY

DECODER TIMING

THOMAS A. STANSELL, Jr.
*INVENTOR*

BY Claude Funkhouser
ATTORNEY

United States Patent Office 3,508,248
Patented Apr. 21, 1970

3,508,248

PHASE MODULATOR DECODER

Thomas A. Stansell, Jr., Ellicott City, Md., assignor to the United States of America as represented by the Secretary of the Navy Filed Oct. 22, 1965, Ser. No. 502,696
Int. Cl. H03k 13/24
U.S. Cl. 340—347 6 Claims

ABSTRACT OF THE DISCLOSURE

Circuitry for decoding input doublet code information wherein one binary code character is represented by the occurrence of a pulse doublet containing a positive pulse followed by a negative pulse and the other binary code character is represented by the occurrence of the inverse pulse doublet. The input doublet code information is applied directly to a first AND gate and, through an inverter, to a second AND gate. The AND gates are controlled to pass single polarity pulses to a common integrator during each code character so as to produce opposite polarity unipolar pulses for the two code characters respectively.

The present invention relates generally to decoding networks and more specifically to an improved phase modulator decoder.

For many years it has been known to be extremely advantageous in the transmission of information by pulse techniques to be able to convert an ordinary unipolar binary code train into a bipolar pseudo-ternary code train. Obviously, it is extremely desirable to recover a binary code from the pseudo-ternary code in many instances. The present invention was developed as an aid in the process of recovering a simple binary code unipolar train from a doublet pair pseudo-ternary code train.

Accordingly, it is an object of the present invention to provide a means for converting phase modulation doublet data into a simple binary code format.

Another object of this invention is to provide a means for converting a pseudo-ternary doublet code signal into a simple binary code signal.

A further object of this invention is to provide a means for converting a pseudo-ternary doublet code signal into a simple unipolar binary code format.

Basically a pseudo-ternary doublet code pulse train is received by a first "and" gate, and the inverse of said pseudo-ternary pulse train is received by a second "and" gate. Said first and second "and" gates receive gating function signals which enable them to pass discrete portions of their received pulse trains. The output signals from said first and second "and" gates are fed to an integrating network and thence to a limiting amplifier.

The attendant advantages of this invention will be better appreciated and said invention will become clearly understood by reference to the following detailed description when considred in conjunction with the accompanying drawings illustrating one embodiment of the instant invention, wherein.

Figure 1:
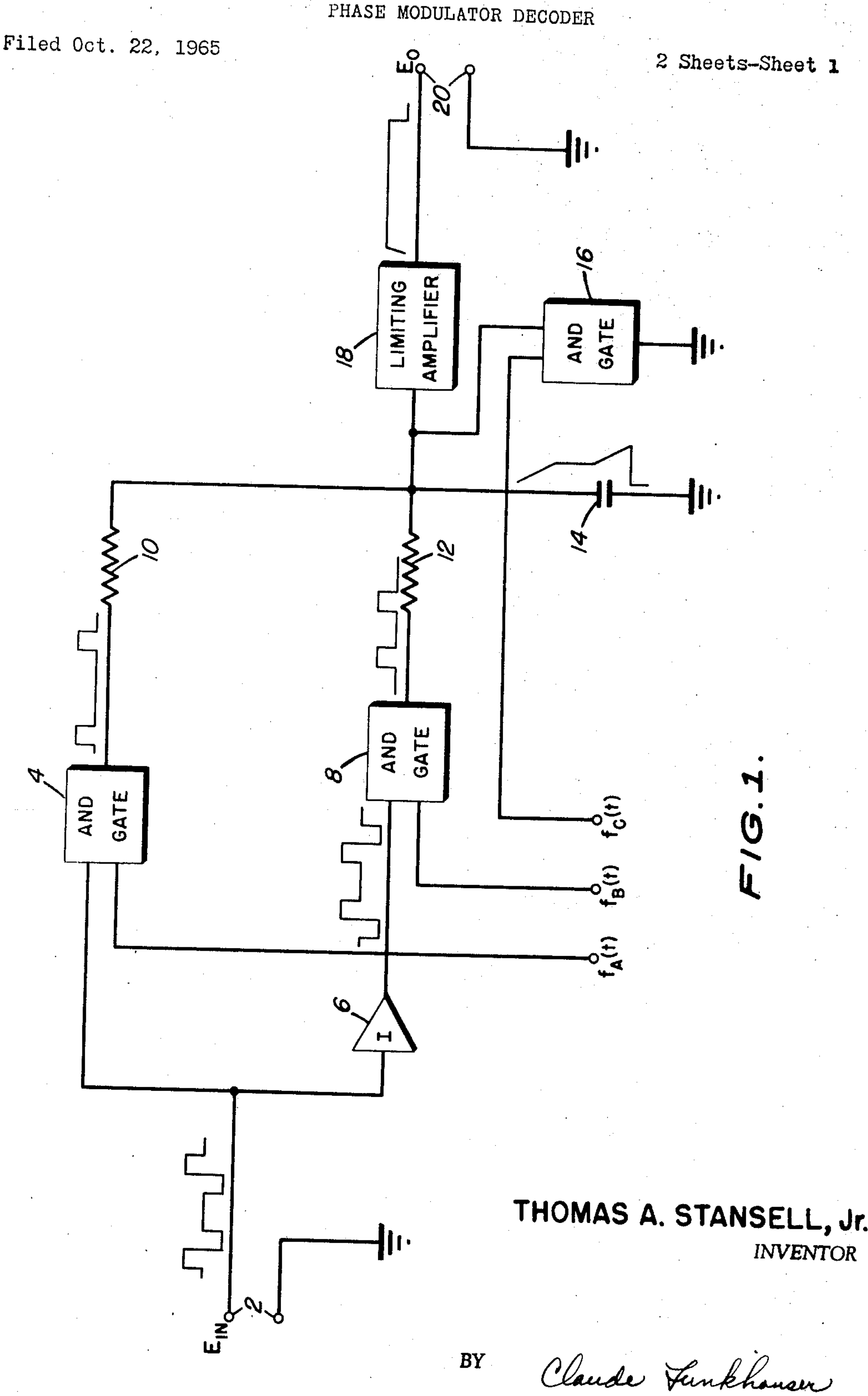
FIG. 1 is a simplified circuit diagram of the instant invention.

Referring to the drawings in more detail, and more specifically to FIG. 1, a pair of input terminals are shown at 2 for receiving a pseudo-ternary doublet code pulse train $E_{in}$. An analog "and" gate 4 and an inverter 6 are connected in parallel so as to each receive a portion of the input signal $E_{in}$ applied to the terminals 2. The analog "and" gate 4 also receives an input signal $f_A(t)$ to be described in more detail infra.

The inverter 6 functions to invert the portion of the input signal $E_{in}$ received at its input and feeds the inverted signal to a second analog "and" gate 8. The "and" gate 8 also receives a second input signal $f_B(t)$ to be described in more detail hereinafter. The "and" gates 4 and 8 are connected at their outputs to the inputs of resistors 10 and 12, respectively. The outputs of resistors 10 and 12 are each connected to one side or plate of a capacitor 14 having its other plate connected to ground. Thus, it can readily be seen that the combination of the resistor 10 and the capacitor 14 serves as an integrating circuit for the output signal from the "and" gate 4, and the combination of the resistor 12 and the capacitor 14 serves as an integrating circuit for the output signal from the "and" gate 8.

A third analog "and" gate 16 is connected in electrical parallelism with a limiting amplifier 18, the combination of said "and" gate 16 and said limiting amplifier 18 being connected in electrical parallelism with said capacitor 14.

Referring again to FIG. 2, the input signal $E_{in}$ is seen to comprise two doublet pairs. By definition the doublet pair between the times $t_0$ and $t_5$ represents a binary one, and the doublet pair between the times $t_6$ and $t_{11}$ represents a binary zero and is the inverse of the binary one doublet pair. The gating functions $f_A(t)$, $f_B(t)$, and $f_C(t)$ are seen to each comprise a plurality of coded binary level unipolar pulses. These gating functions are generated in a well-known manner from any of a number of commonly employed digital sources.

The gating signal $f_A(t)$ is such that it always has a pulse occurring simultaneously with the occurrence of a positive pulse in the doublet pair (of the input signal $E_{in}$) representing a binary one, and the occurrence of a negative pulse in the doublet pair (of the input signal $E_{in}$) representing a binary zero. The gating function $f_B(t)$ is such that it always has a pulse occurring simultaneously with the occurrence of a negative pulse in the doublet pair (of the input signal $E_{in}$) representing a binary one, and the occurrence of a positive pulse in the doublet pair (of the input signal $E_{in}$) representing a binary zero. The gating function $f_C(t)$ is such that it always has a pulse occurring between the doublet pairs of the input signal $E_{in}$.

Referring again to FIG. 1, it should be realized that the gate 4 will only pass that portion of the input signal reaching it simultaneously with the pulses of the gating function $f_A(t)$. Therefore, only the positive pulses of that portion of said input signal representing a binary one and the negative pulses of the binary zero will pass through the "and" gate 4. The signal output of the "and" gate 4 is clearly shown as $E_A$ in FIG. 2.

The "and" gate 8, in a manner analogous to that of said "and" gate 4, will only pass that portion of its input signal occurring simultaneously with the pulses of the gating function $f_B(t)$. However, it must be borne in mind that the input signal to said "and" gate 8 is the inverse of the input signal, $E_{in}$, applied across the terminals 2, due to the action of the inverter 6 thereupon. Accordingly, the output signal from said analog "and" gate 8 will appear as $E_B$ in FIG. 2. The output signals $E_A$ and $E_B$ are integrated by the combinations of the resistors 10 and 12, respectively, with the capacitor 14.

Figure 2:
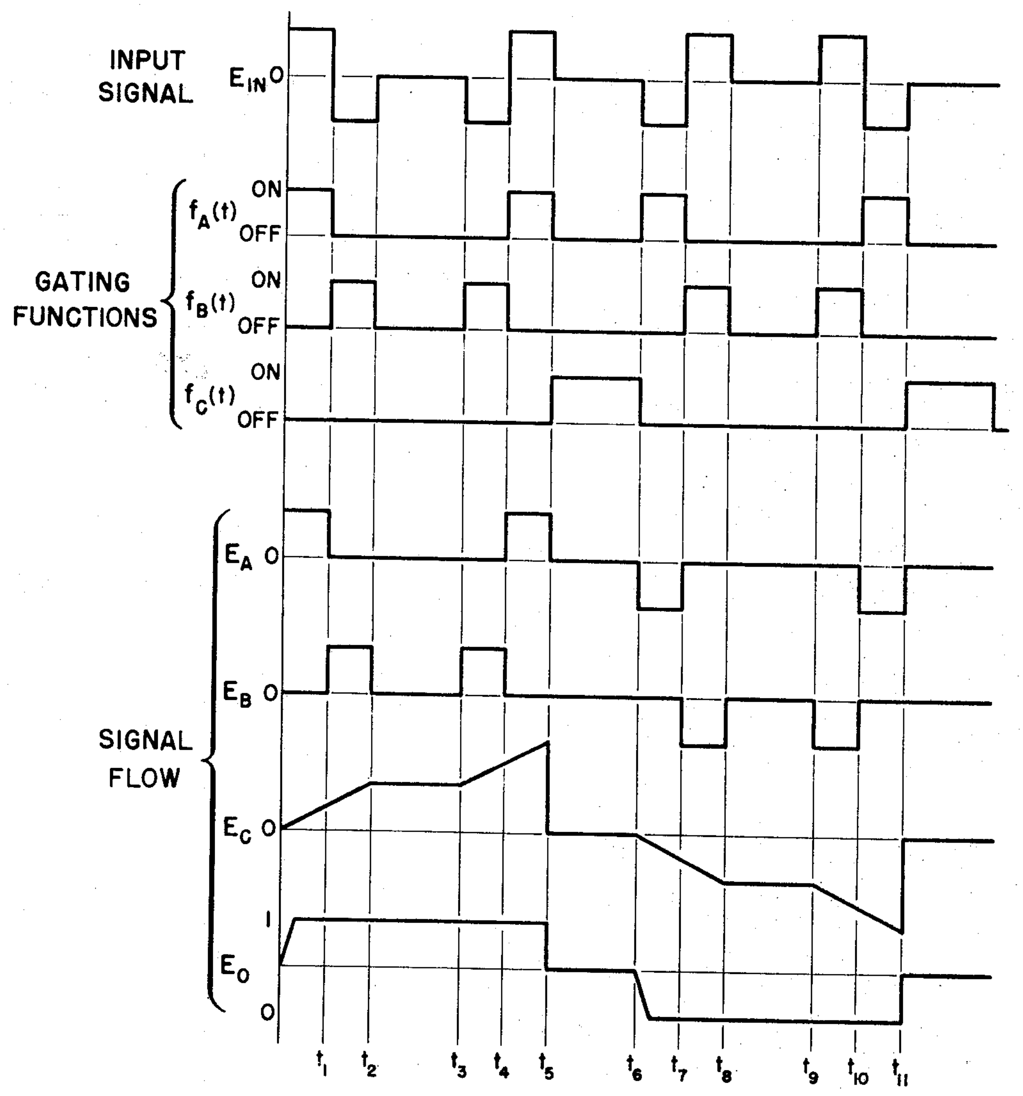
FIG. 2 is a graph of voltage versus time for a plurality of the signals existing at various portions of the circuit of FIG. 1.

The signal across the capacitor 14 will appear as $E_C$ in FIG. 2. Note should be taken of the sharp drop in the signal level $E_C$ to zero at the time $t_5$. This drop is primarily due to the functioning of the analog "and" gate 16. It will be recalled that said gate 16 will receive a gating pulse $f_C(t)$ during the time interval between the doublet pairs (representing the binary one and zero) of the signal $E_{in}$. The gating pulse $f_C(t)$ will turn the "and" gate 16 on causing it to short the capacitor 14, thus effecting the rapid discharge thereof. By the time the doublet pair (of the signal $E_{in}$) representing the binary zero occurs, at the time $t_6$, there will no longer be any input signal $f_C(t)$ present at the "and" gate 16 and the signals $E_A$ and $E_B$ will again charge the capacitor 14.

The output signal $E_C$ across the capacitor 14 is next fed to a limiting amplifier 18, such as is common in the art, where it is limited and amplified to yield the output signal $E_o$ across a pair of output terminals 20. The output signal $F_o$ is easliy recognized as a common unipolar binary code pulse train.

It can readily be seen that many variations and modifications of the present invention are possible in the light of the aforementioned teachings, and it will be apparent to those skilled in the art that various changes in form and arrangement of components may be made to suit requirements without departing from the spirit and scope of the invention. It is therefore to be understood that within the scope of the appended claims the instant invention may be practised in a manner otherwise than is specifically described herein.

What is claimed is:

1. Apparatus for decoding an input doublet code wherein the occurrence of a first code character is represented by a positive pulse followed by a negative pulse and the occurrence of a second code character is represented by a negative pulse followed by a positive pulse, said apparatus comprising, means responsive to said input code for developing a first pair of successive pulses of a single selected polarity in response to occurrence of each positive and negative pulse pair representing said first code character, means responsive to said input code for developing a second pair of successive pulses having a polarity opposite to said selected polarity in response to the occurrence of each negative and positive pulse pair representing said second code character, and means operably connected to said first and second pulse pair developing means for integrating said developed pulse pairs over the respective interval of each of said pairs of successive pulses to generate a first unipolar pulse upon the occurrence of said first code character and a second unipolar pulse having a polarity opposite to said first unipolar pulse upon the occurrence of said second code character.

2. The apparatus specified in claim 1 further including means operably connected to said integrating means for shaping said first and second unipolar pulses into substantially square pulses of opposite polarity.

3. Apparatus for decoding an input doublet code wherein the occurrence of a first code character is represented by a positive pulse followed by a negative pulse and the occurrence of a second code character is represented by a negative pulse followed by a positive pulse, said apparatus comprising, means responsive to said input code for developing a first pulse of a single selected polarity in response to occurrence of each positive pulse and each negative pulse representing said first code character, means responsive to said input code for developing a second pulse having a polarity opposite to said selected polarity in response to the occurrence of each negative pulse and each positive pulse representing said second code character, and means operably connected to said first and second pulse developing means for integrating said developed pulses to generate a first unipolar pulse upon the occurrence of said first code character and a second unipolar pulse having a polarity opposite to said first unipolar pulse upon the occurrence of said second code character, said first and second pulse developing means comprising means for supplying a first gating pulse signal wherein a pulse occurs in coincidence with the first pulse of each code character in said input doublet code, a first AND gate connected to receive said input doublet code and said first gating pulse signal for producing an output pulse to said integrator means upon the occurrence of each code character corresponding in polarity to the first pulse of each code character, an inverter means connected to invert said input doublet code, means for supplying the second gating pulse signal wherein a pulse occurs in coincidence with the second pulse of each code character in said input doublet code, and a second AND gate connected to receive said inverted input doublet code and said second gating pulse signal for producing an output pulse to said integrator means upon the occurrence of each code character opposite in polarity to that of the second pulse in each code character, whereby two output pulses each of one polarity are applied to said integrator means upon the occurrence of said first code character and two output pulses, each of said opposite polarity, are applied to said integrator means upon the occurrence of said second code character.

4. The apparatus specified in claim 3 and further including a means rendered effective during the interval between said first and second code characters for clearing said integrating means.

5. The apparatus specified in claim 4 wherein said integrating means includes a resistance-capacitor circuit and said integrator clearing means comprises means for supplying a third gating pulse signal wherein a pulse occurs during the interval between said first and second code characters, and a third AND gate operably connected in circuit multiple with said integrating capacitor and responsive to said third gating pulse signal to discharge said capacitor during the interval between said first and second code characters.

6. The apparatus specified in claim 5 wherein said first code character is represented by a first doublet pair consisting of a positive pulse followed by a negative pulse and subsequently a negative pulse followed by a positive pulse and said second code character is represented by a doublet pair which is the inverse of said first doublet pair, said first gating pulse signal contains pulses occurring in coincidence with the first and fourth pulses of each code character in said input doublet pair code, said first AND gate produces two output pulses for each code character corresponding in polarity to the first and fourth pulse of said code character, said second gating pulse signal occurring in coincidence with the second and third pulses of each code character in said input doublet pair code and, said second AND gate produces two output pulses for each code character opposite in polarity to that of the second and third pulses in said code character, whereby four output pulses each of one polarity are applied to said integrator means upon the occurrence of said first code character and four output pulses each of the opposite polarity are applied to said integrator means upon the occurrence of said second code character.

References Cited

UNITED STATES PATENTS

| | | | |
|---|---|---|---|
| 3,166,712 | 1/1965 | Graham | 325—321 |
| 3,237,055 | 2/1966 | Riordan | 317—123 |
| 2,700,149 | 1/1955 | Stone | 328—119 X |
| 3,400,369 | 9/1968 | Cooper | 340—347 |
| 3,419,804 | 12/1968 | Gorog et al. | 328—38 |

MAYNARD R. WILBUR, Primary Examiner

C. D. MILLER, Assistant Examiner

U.S. Cl. X.R.

325—38